United States Patent
Lübbe et al.

(10) Patent No.: US 6,411,717 B1
(45) Date of Patent: *Jun. 25, 2002

(54) SWITCHED CAPACITOR FILTER WITH A NEUTRAL BYPASS SETTING

(75) Inventors: Jürgen Lübbe, Jacobneuharting; Peter Kirchlechner, Hohenthann; Jörg Schambacher, München, all of (DE)

(73) Assignee: STMicroelectronics GmbH, Grasbrunn (DE)

( * ) Notice: Subject to any disclaimer, the term of this patent is extended or adjusted under 35 U.S.C. 154(b) by 0 days.

This patent is subject to a terminal disclaimer.

(21) Appl. No.: 08/900,610

(22) Filed: Jul. 25, 1997

(30) Foreign Application Priority Data

Jul. 26, 1996 (DE) .......................... 196 30 416

(51) Int. Cl.⁷ .............................................. H03G 5/00
(52) U.S. Cl. .......................................... 381/98; 381/100
(58) Field of Search ........................... 381/98, 99, 103, 381/104, 107, 100; 333/173, 28 T, 28 R; 708/819

(56) References Cited

U.S. PATENT DOCUMENTS

| | | | |
|---|---|---|---|
| 4,099,134 A | | 7/1978 | Schroder ...................... 330/51 |
| 4,292,468 A | * | 9/1981 | Yokoyama .................... 300/85 |
| 4,439,739 A | * | 3/1984 | Kilian et al. ................ 300/107 |
| 4,468,798 A | | 8/1984 | Riebeek ........................ 377/57 |
| 4,633,425 A | | 12/1986 | Senderwicz ................. 364/825 |
| 4,849,662 A | * | 7/1989 | Holberg et al. ............. 327/554 |
| 4,987,383 A | | 1/1991 | Mauthe ....................... 330/279 |
| 5,039,963 A | | 8/1991 | Fischer ........................ 333/173 |
| 5,841,876 A | * | 11/1998 | Gifford et al. ........... 381/71.14 |
| 5,953,430 A | * | 9/1999 | Kirchlechner et al. ...... 381/102 |

FOREIGN PATENT DOCUMENTS

| | | |
|---|---|---|
| GB | 2 138 231 A | 10/1984 |
| GB | 2 159 014 A | 11/1985 |
| WO | 95 13655 A | 5/1995 |

OTHER PUBLICATIONS

Horowitz et al "The art of electronics" 1989, pp. 281–284.*

* cited by examiner

Primary Examiner—William Korzuch
Assistant Examiner—Angela Armstrong
(74) Attorney, Agent, or Firm—Lisa K. Jorgenson; Robert Iannucci; Seed IP Law Group, PLLC (57) ABSTRACT

An SC filter with intrinsic anti-alias function for adjustably decreasing or increasing the amplitude of audio signals in a predetermined frequency range. The SC filter includes a filter module having an RC network with at least one frequency-response-determining RC member whose resistor component R is realized in SC technology. The SC filter also includes a setting means connected to the filter module such that its setting determines the frequency response of the SC filter. The setting means also renders possible a neutral setting in which the effective audio signal path of the SC filter circumvents the filter module so that no decrease or increase of the amplitude of individual frequency portions takes place. An anti-alias low pass filter unit is connected into the audio signal path when the setting means is not set to the neutral setting and the anti-alias low pass filter unit is not located in the audio signal path when the setting means is set to the neutral setting. Furthermore, an audio singal processor may include such a filter.

5 Claims, 9 Drawing Sheets

SWITCHED CAPACITOR FILTER WITH A NEUTRAL BYPASS SETTING

TECHNICAL FIELD

The invention relates to a switched capacitor (SC) filter with intrinsic anti-aliasing function and to an audio signal processor provided with such a filter.

BACKGROUND OF THE INVENTION

The document GB 2 138 231 A describes a filter circuit comprising an SC filter that is adjustable with respect to its frequency response, in which in a neutral setting the effective audio signal path circumvents the SC filter, so that no decrease or increase of the amplitude of individual frequency ranges takes place. It is known furthermore from said GB 2 159 014 A to connect an anti-alias filter upstream of an SC filter.

With apparatus in the field of entertainment electronics, such as for example radio receivers, cassette recorders, CD players and the like, it is usual to provide in the audio signal path adjustable filter circuits through which the user can take influence on certain sound characteristics, such as for example treble boost and treble cut or bass emphasis and bass cut. The adjustment of suitable filter characteristics is made by the user by means of operating members provided therefor. The adjustable filter circuits, for purposes of influencing the audio signals in entertainment electronics equipment, are designed as a rule such that they permit in particular also a neutral setting in which they have as little influence as possible with respect to frequency and phase response.

In case the user desires no emphasis or de-emphasis at all of certain frequency ranges of the audio signal, he will select this neutral setting of the respective filter circuit.

With respect to numerous apparatus to be associated with the field of entertainment electronics, such as for example with compact radio receivers as used in particular for installation in motor vehicles, a trend can be observed for a long time to achieve a cost reduction in manufacture by putting together the entire electrical circuit of the receiver from as little as possible highly integrated electronic components.

Figure 6:
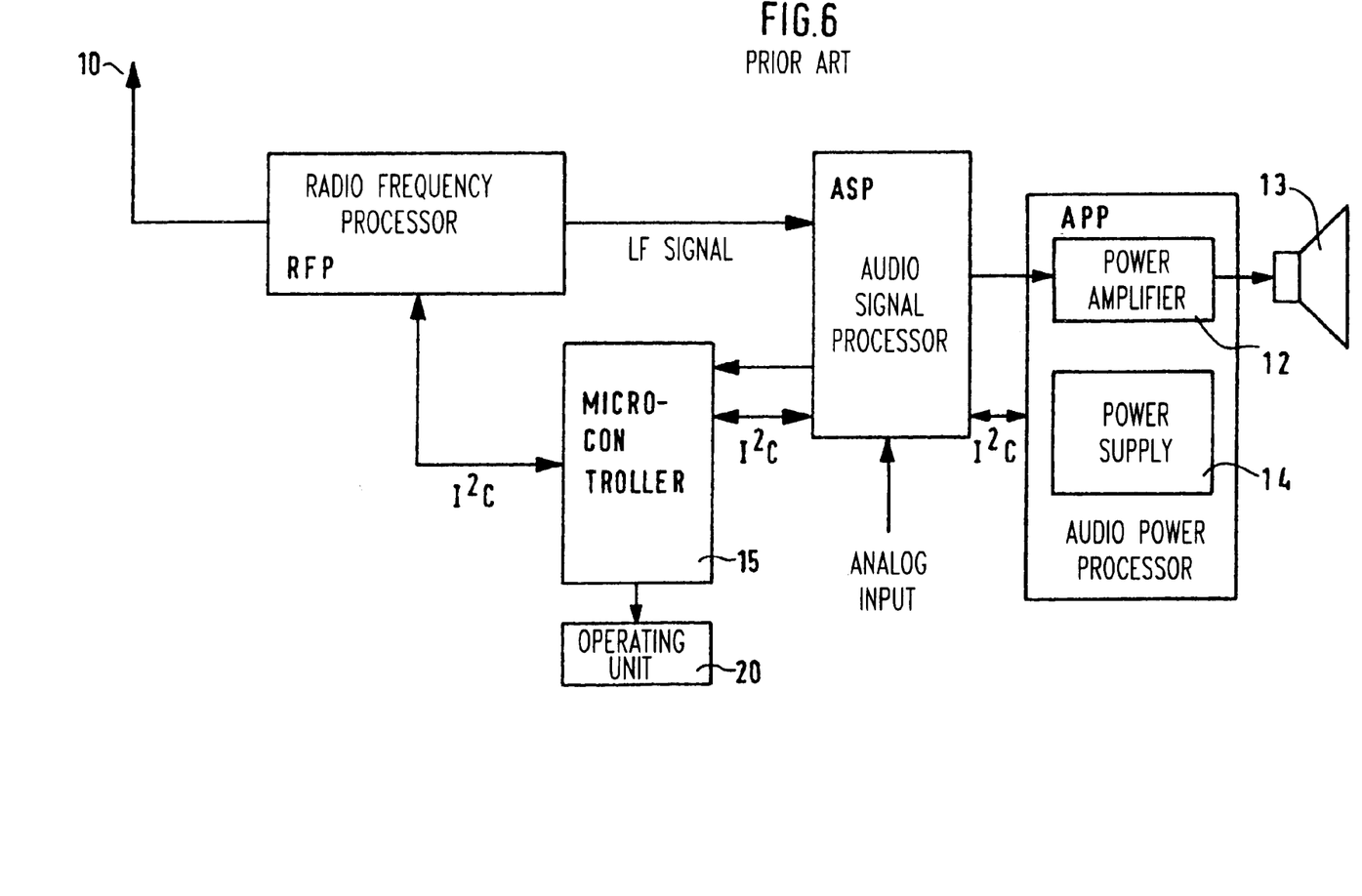
FIG. 6 shows a schematic block diagram of a radio receiver according to the prior art.

FIG. 6 shows a block diagram of an exemplary audio receiver. The radio frequency signals delivered from a radio frequency antenna 10 are supplied to a radio frequency receiver, hereinafter referred to as "radio frequency processor" RFP. Radio frequency processor RFP comprises radio frequency pre-stages, tuners, intermediate frequency amplifiers and intermediate frequency filters as well as demodulators. A low frequency (LF) signal constituting the useful signal of the station received is fed to an audio signal processor ASP. This low frequency signal does not only include the demodulated audio signal, but also auxiliary signals for stereo reception, ARI identification, RDS and so on.

The audio signal processor ASP in particular converts the low frequency signal delivered by radio frequency processor RFP into audio signals which are fed to an audio power processor APP. The audio power processor APP comprises in particular a power amplifier 12 amplifying the output signals delivered from audio signal processor ASP, to such an extent that these can be reproduced through loudspeakers 13. Furthermore, the audio power processor APP comprises a voltage regulating module 14 for power supply.

The audio signal processor ASP may be fed, via additional analog inputs, with other audio signals, for example from cassette recorders, CD players or the like.

The audio receiver described is controlled in its entirety by a microcontroller 15 which is provided with an operating unit 20 that is accessible to the user. The exchange of data between microcontroller 15 on the one hand and radio frequency processor RFP, audio signal processor ASP and audio power processor APP on the other hand takes place through a conventional I$^2$C bus.

Figure 7:
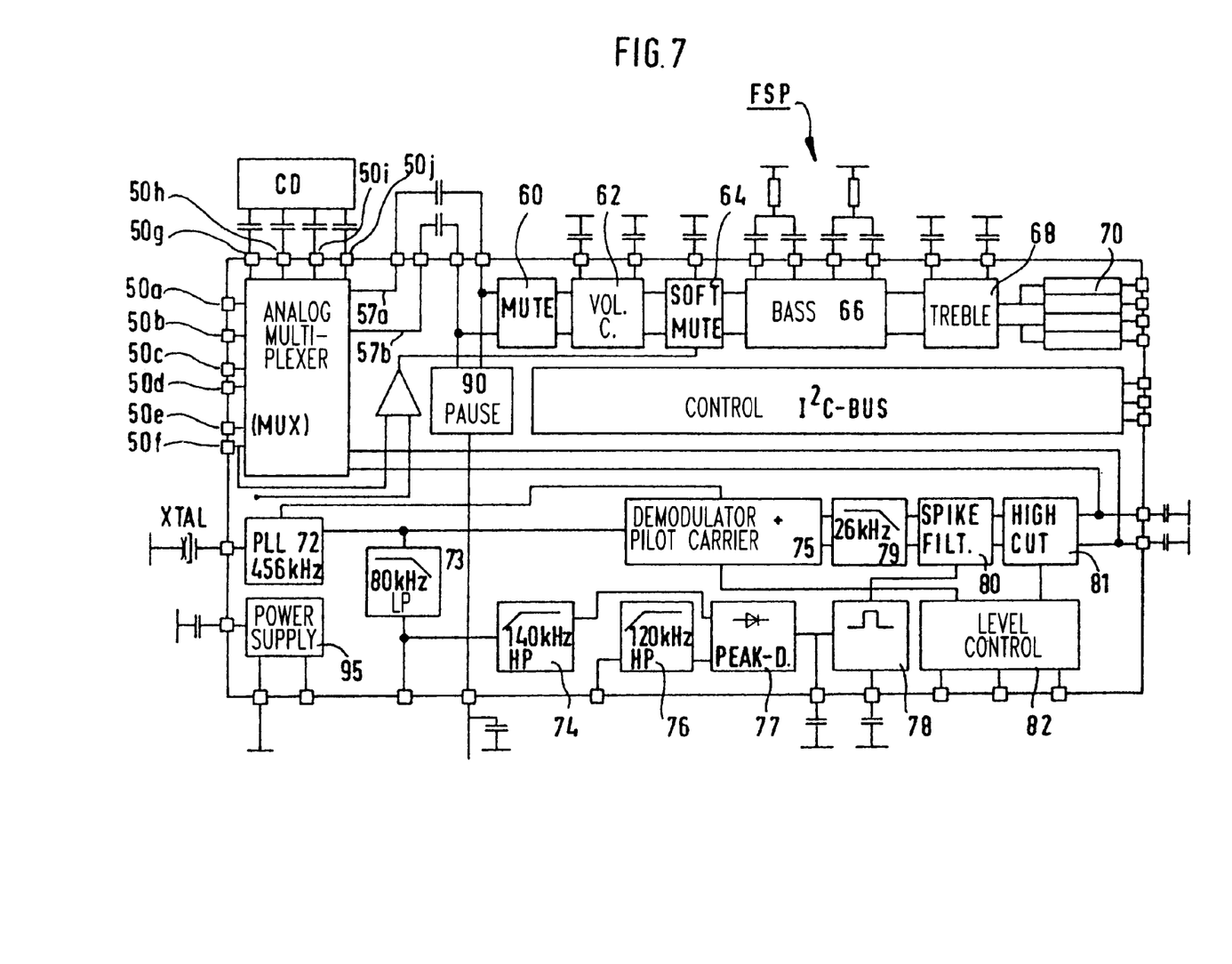
FIG. 7 shows a schematic block diagram of the audio signal processor of the radio receiver of FIG. 6 with some peripheral circuitry.

FIG. 7 shows a schematic block diagram of the integrated audio signal processor ASP of the audio receiver shown in FIG. 6. The audio signal processor ASP has a number of analog audio signal inputs 50a to 50j that are connected to corresponding input lines of an analog multiplexer 55. A stereo output signal of analog multiplexer 55 is fed via output lines 57a and 57b to a chain of series-connected blocks 60, 62, 64, 66, 68 acting as signal processors.

The audio signals first enter a muting filter ("mute") 60, and then in succession a volume control with loudness filter 62, a second muting arrangement with soft muting property ("soft mute") 64, a bass control ("bass") 66 as well as a treble control 68 ("treble"). The stereo audio signals then are fed to a number of audio driver amplifiers 70, where they are conditioned to such an extent that they are suitable for controlling the power output stages in power amplifier 12 within audio power processor APP.

In this respect, each channel of the stereo signal is split to a first sub-channel for a first loudspeaker to be installed in the front of the passenger compartment and a second sub-channel for a second loudspeaker to be installed in the rear of the passenger compartment.

The audio signal processor comprises furthermore a number of usual functional blocks 72 to 82 which are necessary for processing the stereo differential signal, the ARI signal etc. Finally, there is provided a pause circuit 90 and a power supply means 95.

It is apparent to the expert that the audio signal processor ASP represented in FIGS. 6 and 7 does not constitute the sole possible embodiment of such a processor. In particular, the audio signal processor ASP may also be implemented without the functional units for processing FM stereo signals. The type and the number of the LF stages for taking influence on the audio signal may also vary for each particular case.

The circuit described hereinbefore involves the disadvantage that there is no complete integration of the audio filters 62, 66, 68 since numerous RC members with high resistances are realized by means of external components because of a too large space requirement of the resistors R.

When employing the so-called "switched capacitor" filter technology ("SC technology"), high resistances, which in case of direct implementation would cause consumption of much chip area, are substituted by arrangements with switched capacitors. Filter circuits with switched capacitors as such are known for example from "Analog MOS Integrated Circuits for Sigal Processing" by Roubik Gregorian and Gabor C. Temes, John Wiley & Sons. This circuit technology facilitates indeed the complete integration of filter circuits on a semiconductor chip, but entails also other consequential problems.

In case of the "switched capacitor" filter technology, the useful signals are sampled de facto with the frequency at which capacitors are switched that are used for re-storing charges. According to the basic sampling theorem of Shannon, an analog signal s(t) is described completely by equidistant sampling values in a time distance $\Delta t$ only when the frequency spectrum of s(t) above an upper limit frequency $f_{max}$ is identical to zero:

$$f_{max} = \frac{1}{2\Delta t} \quad (1)$$

The upper useful limit frequency thus is half of the sampling frequency, and signal portions of higher frequencies above $f_{max}$ result in the so-called "aliasing effect", i.e., the energy content of these higher-frequency signal portions makes itself felt in the baseband in the form of interference signals. The principles of the aliasing effect are known, for example, from "Nachrichtentechnik", Vol. II: "Nachrichtenubertragung", by W. Rupprecht, Springer-Verlag, Berlin et al., 1982, pages 75 to 78.

A conventional countermeasure against this aliasing effect consists in providing in front of a filter chain realized in the form of "switched capacitor" technology, an input low pass whose characteristics are suitably selected such that signal portions with frequencies higher than $f_{max}$ are sufficiently strongly attenuated.

However, this circuit technology involves the disadvantage that background noise and distortions of the input low pass filter are superimposed on the useful signal also when the filter or filter chain is in the neutral setting.

SUMMARY OF THE INVENTION

It is thus an object of the invention to make available an adjustable SC filter with anti-alias function as well as audio signal processor provided with such a filter, which do not involve the prior art disadvantages and which in particular can easily be integrated completely and feature low noise and distortion also in the neutral position.

This object is met according to the invention by an SC filter according to claim 1. The subclaims indicate developments of the subject matters of the alternative independent claims.

DETAILED DESCRIPTION OF THE INVENTION

Figure 1:
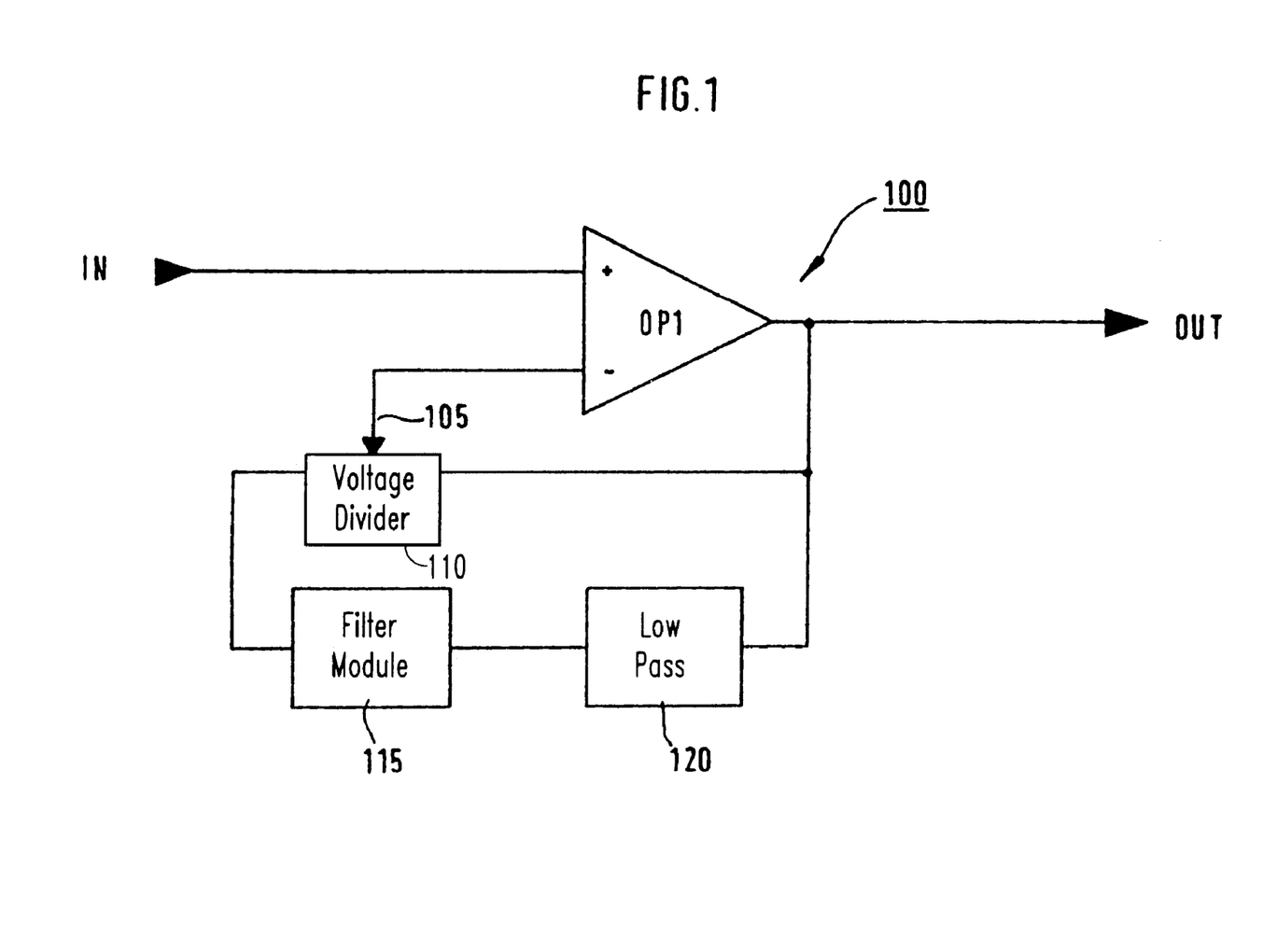
FIG. 1 shows a block diagram of an adjustable audio SC filter with intrinsic anti-alias function according to the invention, which is designed in SC technology.

FIG. 1 shows a block diagram of an adjustable SC technology audio filter 100 with intrinsic anti-alias function according to the invention, which is suitable in particular for use in an audio signal processor ASP as shown for example in FIG. 7. The circuit shown in FIG. 1 then is suitable in particular for implementation of the loudness filter 62, the bass filter 66 and of the treble filter 68 of FIG. 7.

The audio filter 100 comprises an input IN connected to the non-inverting input of an operational amplifier OP1 as well as an output OUT connected to the output thereof. The inverting input of operational amplifier OP1 is connected to a tap 105 of an ohmic voltage divider 110 connected between the output of operational amplifier OP1 and the output of a filter module 115 and realized in SC technology. The input of filter module 115 is connected via an anti-alias low pass 120 to the output of operational amplifier OP1.

The setting of the tap 105 of ohmic voltage divider 110 determines the effectiveness of the filter with anti-aliasing connected in accordance with the invention, as shown in FIG. 1. When the tap 105 of ohmic voltage divider 110 is set such that it is directly short-circuited with the output of operational amplifier OP1, the circuit shown in FIG. 1 behaves like a voltage follower with a unity amplification factor. The filter module 115 as well as anti-alias low pass 120 are not located in the signal path. In this case, the filter 100 is in its neutral setting, and neither the filter module 115 nor the anti-alias low pass 120 feed noise voltages into the audio output signal at output terminal OUT or cause signal distortions.

In the extent in which the tap 105 of the ohmic voltage divider 110 is changed in its setting such that a partial resistance between the output of operational amplifier OP1 and tap 105 becomes effective, the filter module 115 and the anti-alias low pass 120 enter into the signal path and take influence on the frequency characteristics of the filter 100. As such, the ohmic voltage divider acts as a filter control unit that determines whether the filter module 115 and the anti-alias low pass 120 will affect the input audio signal received by the audio filter 100.

The output signal at the output terminal of operational amplifier OP1 is subjected to a negative feedback, via anti-alias low pass 120, filter module 115 as well as voltage divider 110, to the inverting input of operational amplifier OP1. Anti-alias low pass 120 prevents that signal portions with a frequency higher than a maximum frequency $f_{max}$, i.e., half of the switching frequency of switched capacitors within filter module 115, from reaching the input of filter module 115.

Anti-alias low pass 120 may be designed in particular as a conventional RC low pass. It is also possible to combine the functions of anti-alias low pass 120 and of filter module 115 in a complex filter circuit.

The ohmic voltage divider 110 may be designed as a conventional potentiometer. However, when used in an integrated circuit, it turns out to be advantageous to design ohmic voltage divider 110 for example as a resistor chain switched by MOS switches. When the filter circuit according to FIG. 1 is used in an audio signal processor (as shown in FIG. 7, for example), it is possible to adjust the ohmic voltage divider 110 by a digital setting means, e.g., via the I²C bus.

Figure 2A:
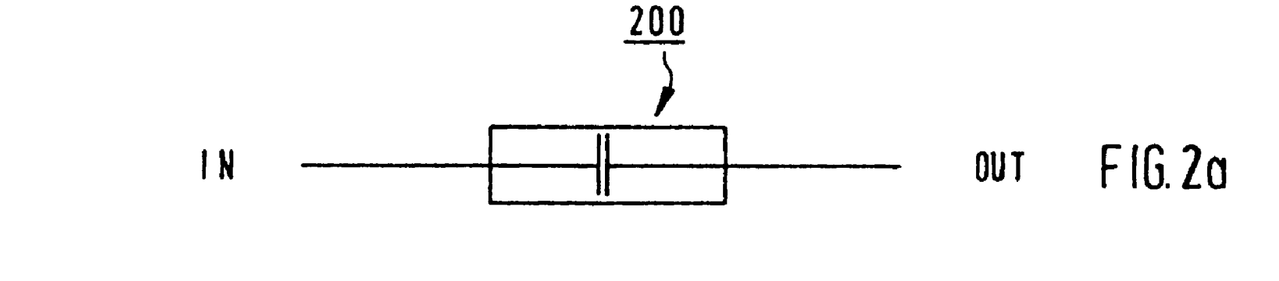
FIG. 2a is a schematic view of a resistor member 200 designed as switched capacitor.
Figure 3:
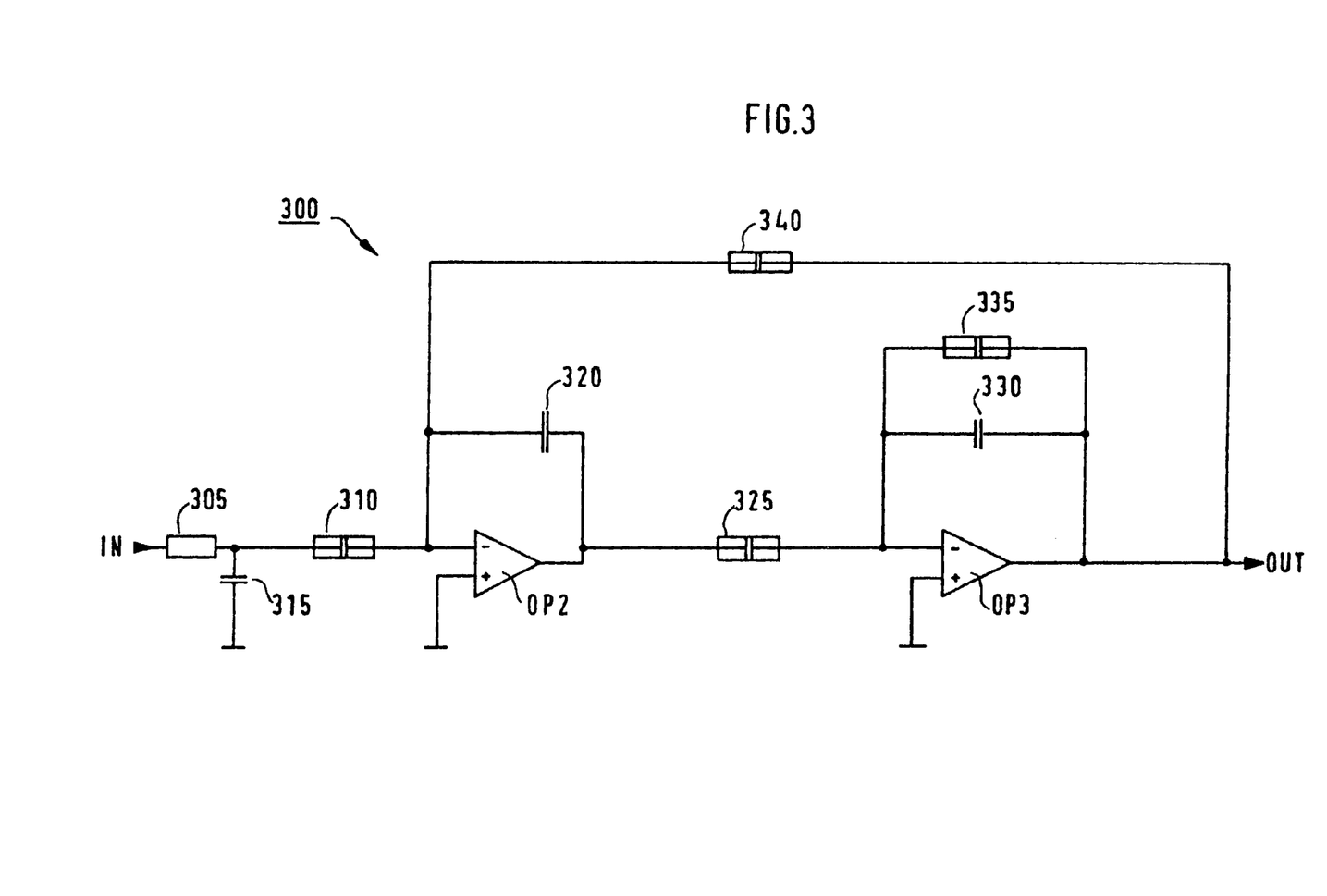
FIG. 3 shows a circuit diagram of a first embodiment of the filter module with anti-alias low pass of FIG. 1, namely for a loudness filter.
Figure 4:
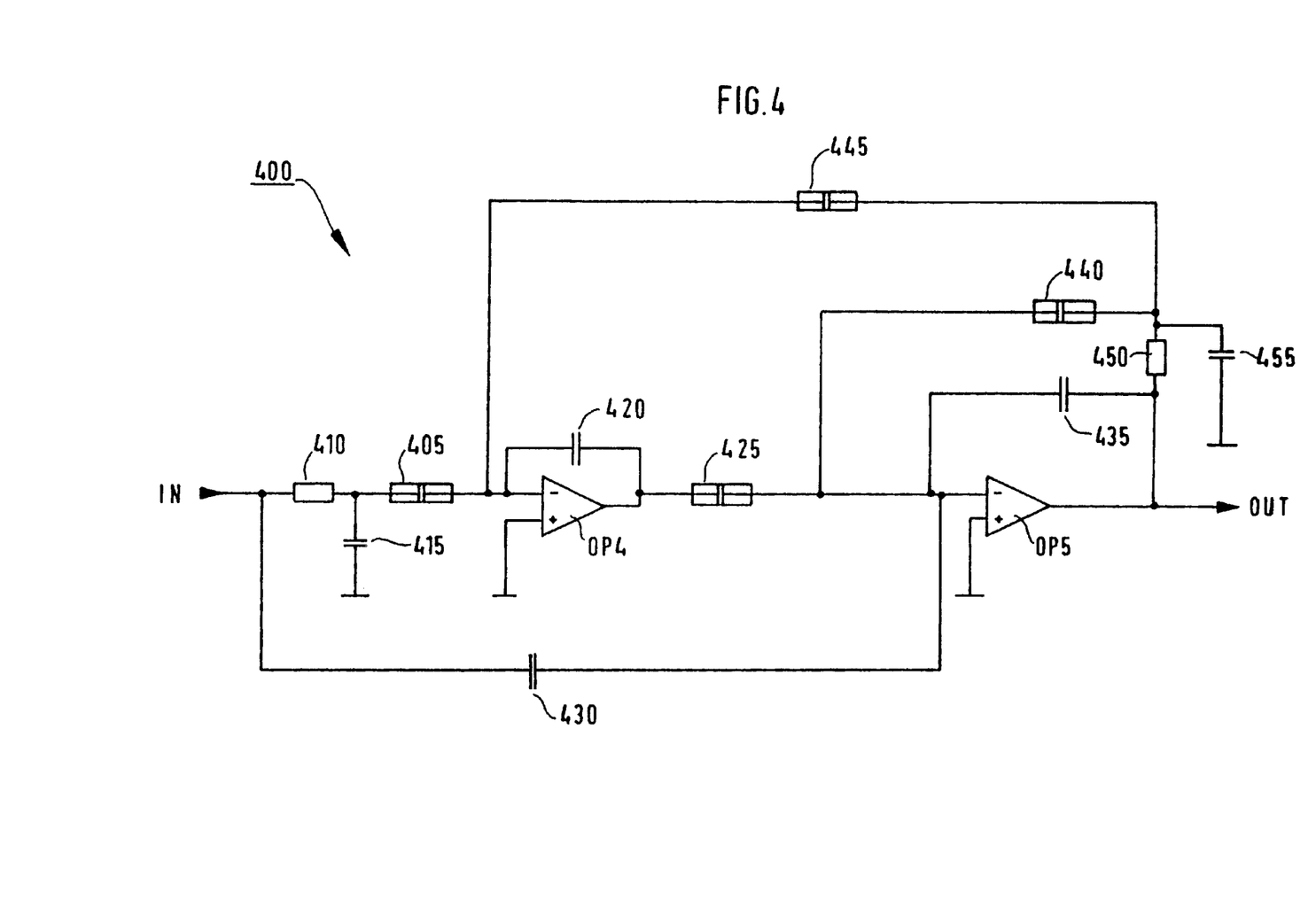
FIG. 4 shows a second embodiment of the filter module with anti-alias low pass of FIG. 1, namely for a bass filter.
Figure 5:
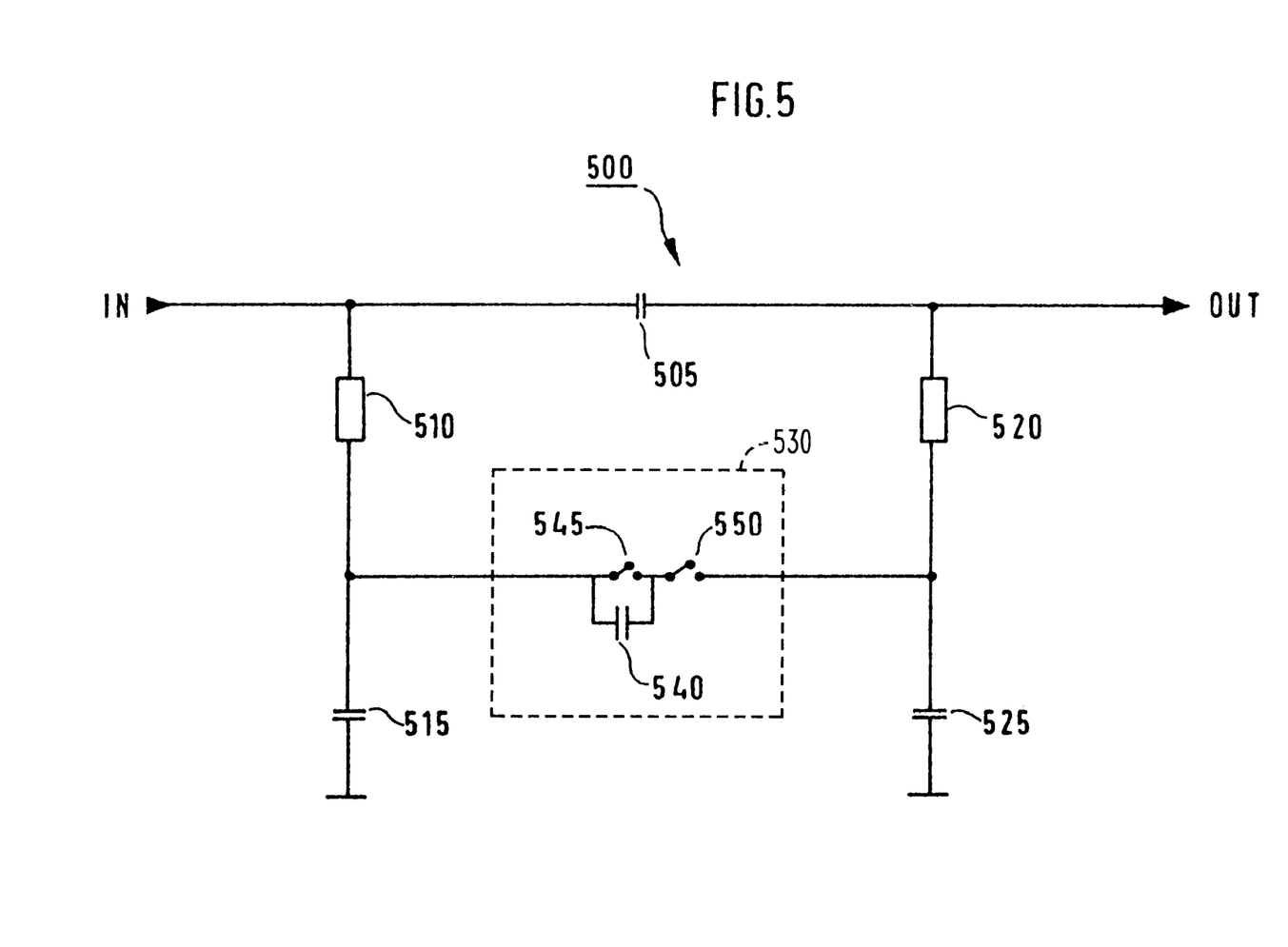
FIG. 5 shows a circuit diagram of a third embodiment of the filter module with anti-alias low pass of FIG. 1, namely for a treble filter.

FIG. 2a shows a schematic representation of a resistor member 200 implemented with a switched capacitor, as employed in the embodiments shown in FIGS. 3 to 5.

Figure 2B:
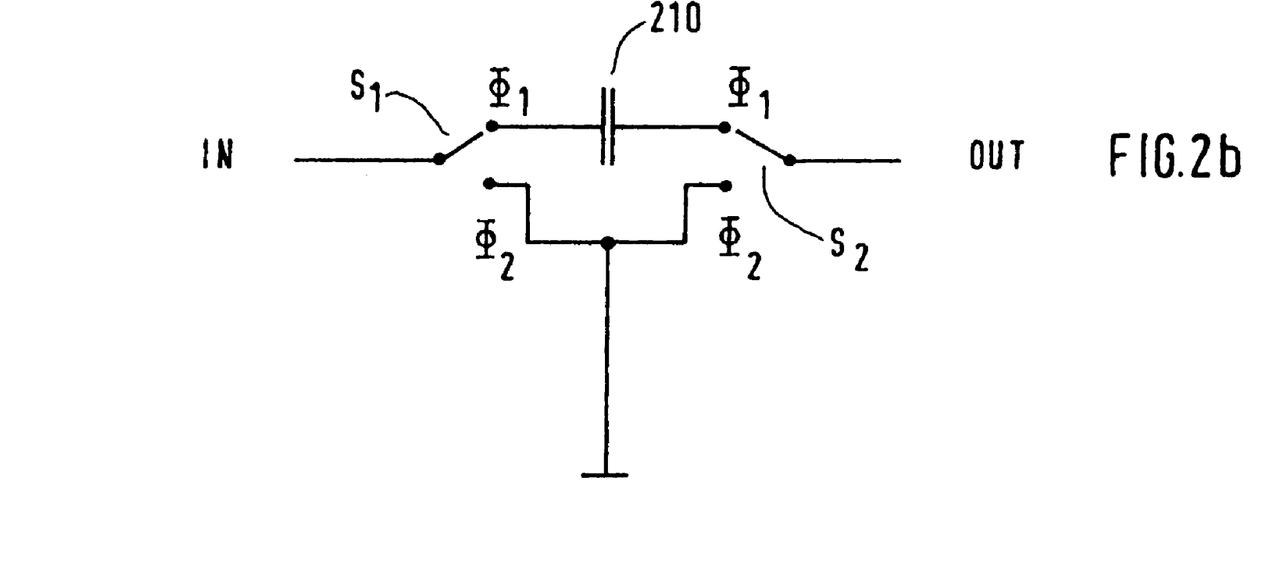
FIG. 2b is an equivalent circuit diagram of resistor member 200.

FIG. 2b shows an electrical equivalent circuit diagram of the resistor member 200 shown in FIG. 2a. Input IN of the circuit may be connected via a first switch S1 to a first terminal of a capacitor 210, or may be connected to ground.

Output terminal OUT may be connected via a second switch S2 to a second terminal of capacitor 210, or may be connected to ground. When the switches S1, S2 are not addressed, they are in an electrically open state.

Figure 2C:
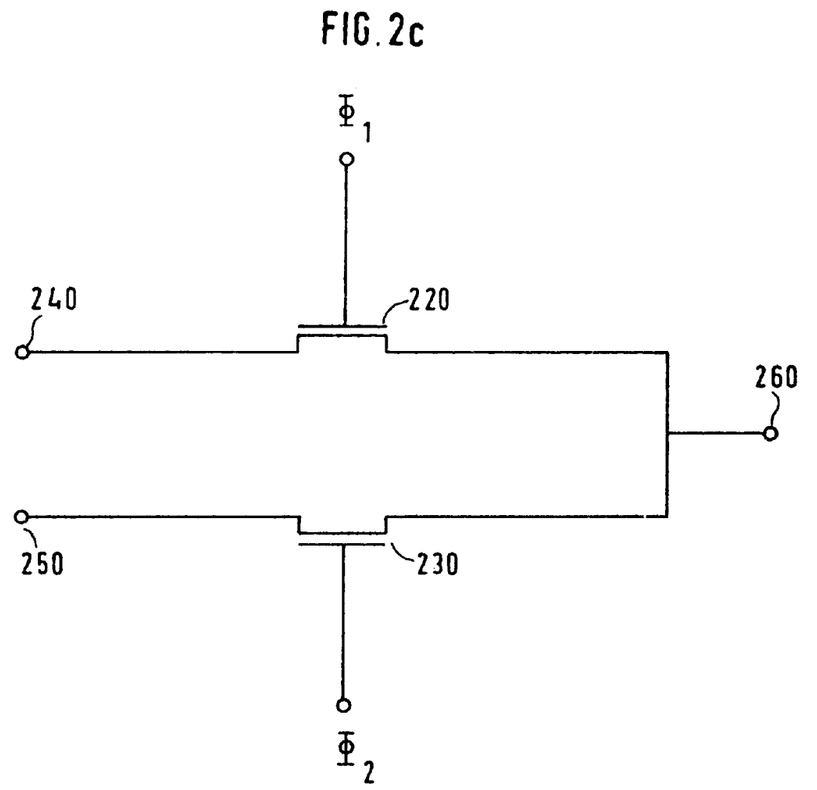
FIG. 2c shows an exemplary implementation of a switching means of FIG. 2b utilizing two MOS-transistors.
Figure 2D:
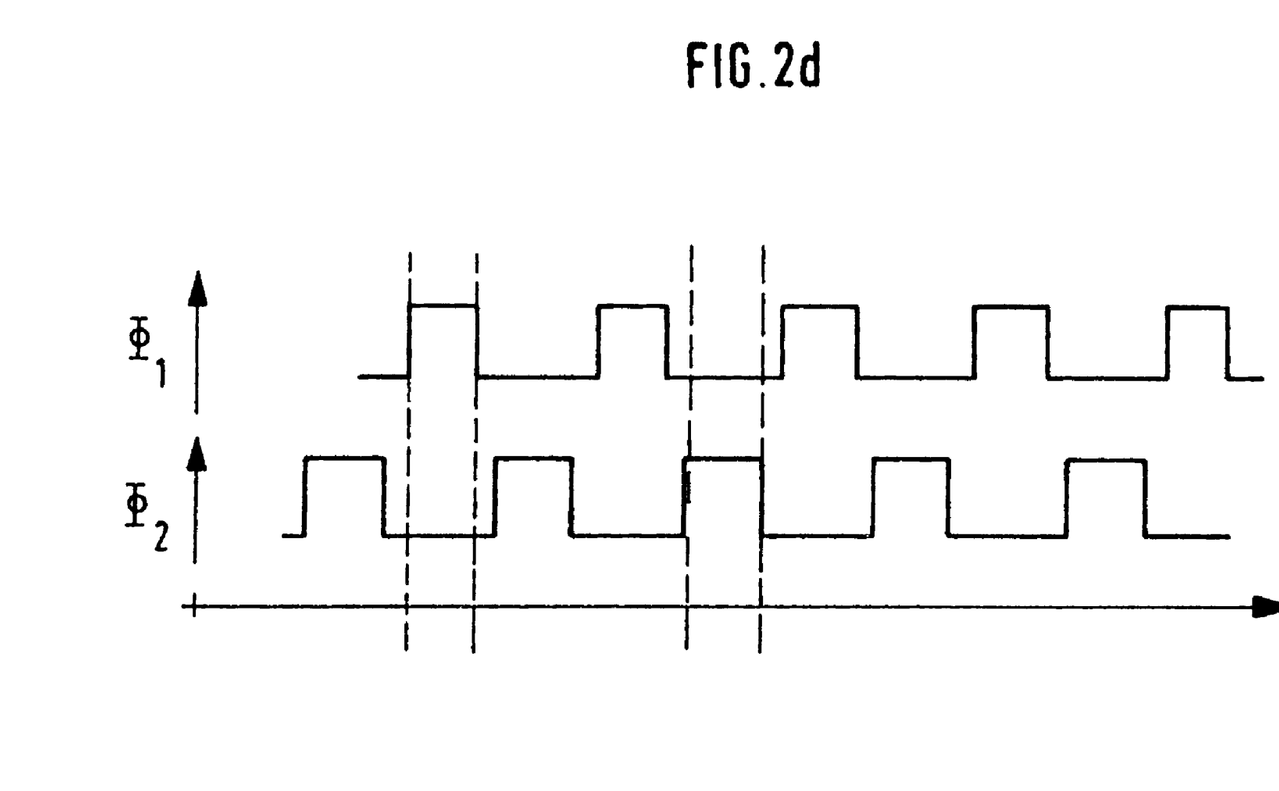
FIG. 2d shows clock signals which are free from overlapping.

FIG. 2c shows an exemplary implementation of the switches S1, S2 of FIG. 2b using two MOS transistors 220, 230. A first MOS transistor 220 connects, via its source-drain path, a common terminal 260 to a first switch output terminal 240, whereas a second MOS transistor 230 connects, via its source-drain path, the common terminal 260 to a second switch output terminal 250. The gate of first MOS transistor 220 is connected to the clock signal $\Phi_1$, whereas the gate of the second MOS transistor 230 is connected to clock signal $\Phi_2$. FIG. 2d shows clock signals $\Phi_1$, $\Phi_2$ for controlling the switches S1, S2 in FIG. 2b and the MOS transistors 220, 230 in FIG. 2c, respectively. As is usual in SC technology, the two clock signals $\Phi_1$, $\Phi_2$ are designed such that their high-level (active) intervals do not overlap at any time. The effect achieved thereby is that in the circuit according to FIG. 2c there is always only a single one of the two MOS transistors 220, 230 conducting and the common terminal 260 thus is open or is connected either to first switch terminal 240 or to second switch terminal 250, but never to both simultaneously.

FIG. 3 shows an electric circuit diagram of a first embodiment 300 of a filter module 115, namely for a loudness filter with anti-alias property, combining therein the functional blocks of filter module 115 and of anti-alias low pass 120 of FIG. 1. The circuit embodies a low pass of the second order and is designed in SC technology.

An input IN is connected to the inverting input of an operational amplifier OP2 via a first low pass resistor 305 and a first resistor 310 designed in SC technology. The second terminal of first low pass resistor 305, which is not directly connected to input terminal IN, is connected to ground via a first low pass capacitor 315. The non-inverting input of operational amplifier OP2 is connected to ground.

The output of operational amplifier OP2 is connected via a capacitor 320 to the inverting input thereof The inverting input of a further operational amplifier OP3 is connected via a second resistor 325 designed in SC technology to the output of operational amplifier OP2. The non-inverting input of operational amplifier OP3 is also connected to ground.

The output of operational amplifier OP3 is connected via a third capacitor 330 to the inverting input thereof Connected in parallel to third capacitor 330 is a third resistor 335 in SC technology. A fourth resistor 340 in SC technology connects the inverting input of operational amplifier OP2 to the output of operational amplifier OP3.

The output of operational amplifier OP3 is connected to an output OUT.

The resistor 305 as well as capacitor 315 constitute anti-alias low pass 120 in FIG. 1. Operational amplifier OP2 as well as operational amplifier OP3 and the remaining components correspond to filter module 115 in FIG. 1.

FIG. 4 shows an electric circuit diagram of a second embodiment 400 of a filter module 115 with anti-alias low pass 120. The circuit shown in FIG. 4 is employed in a bass filter.

The inverting input of an operational amplifier OP4 is connected to an input IN via a first resistor 405 in SC technology and a first low pass resistor 410. The terminal of low pass resistor 410 that is not directly connected to input terminal IN, is connected to ground via a first low pass capacitor 415. The non-inverting input of operational amplifier OP4 is also connected to ground. The output of operational amplifier OP4 is connected via a first filter capacitor 420 to its inverting input. The inverting input of an additional operational amplifier OP5 is connected via a second resistor 425 in SC technology to the output of operational amplifier OP4. The inverting input of operational amplifier OP5 is connected furthermore via a second filter capacitor 430 to input IN and via a third filter capacitor 435 to the output of operational amplifier OP5. Finally, inverting input of operational amplifier OPS is connected via a third resistor 440 in SC technology and a fourth resistor 445 in SC technology to the inverting input of operational amplifier OP4.

The terminal of the third resistor 440 in SC technology that is not directly connected to the inverting input of operational amplifier OP5 as well as the terminal of the third filter capacitor 435 that is not directly connected to the inverting input of operational amplifier OP5, are connected to each other via a second low pass resistor 450. The connecting node between the SC technology resistors 440 and 445 is connected to ground via a second low pass capacitor 455. The output of operational amplifier OP5 is connected to output terminal OUT.

The filter circuit 400 constitutes a modified biquad filter. RC members 410, 415 as well as 450, 455 correspond to anti-alias low pass 120 in FIG. 1, whereas all other components, inclusive of the two operational amplifiers OP4 and OPS, correspond to filter module 115 in FIG. 1.

The first low pass 410, 415 filters higher-frequency signal portions in front of first SC technology resistor 405.

Higher-frequency signal portions may nevertheless reach the inverting input of operational amplifier OP5 and the SC technology resistors 440, 445 via capacitor 430. In order to suppress these higher frequency signal portions there as well, a second low pass 450, 455 is provided.

FIG. 5 shows an electric circuit diagram of a third embodiment 500 of a filter module 115, namely for a treble filter. An input IN is connected via a first capacitor 505 to an output OUT. Moreover, input IN is connected via a first resistor 510 and a second capacitor 515 to ground. The output terminal OUT is also connected to ground via a second resistor 520 and a third capacitor 525. The coupling points between resistor 510 and capacitor 515 as well as resistor 520 and capacitor 525 are connected to each other via a resistor 530 in SC technology. The SC resistor 530 includes a capacitor 540 connected in parallel with a first switch 545 and in series with a second switch 550.

The circuit shown in FIG. 5 corresponds to the functional blocks of filter module 115 and of anti-alias low pass 120 in FIG. 1.

The circuit shown in FIG. 5 allows that a frequency-dependent voltage drop of the third order can be achieved across SC resistor 530, corresponding to approx. 60 decibel per decade.

It should be understood that even though numerous features and advantages of the present invention have been set forth in the foregoing description, the above disclosure is illustrative only. Changes may be made in detail and yet remain within the broad principles of the present invention.

What is claimed is:

1. An SC filter with an anti-alias function for adjustably decreasing or increasing the amplitude of audio signals in a predetermined frequency range, comprising:
   an input and an output;
   a first operational amplifier having a non-inverting input connected to the input and having an output being connected to the output;

an ohmic voltage divider having a tap connected to an inverting input of the first operational amplifier;

a filter module having an RC network with at least one frequency-response-determining RC member with a resistor component R that is realized in SC technology; and an anti-alias low pass filter unit having an input and an output, wherein the output of the first operational amplifier is connected to the input of the anti-alias low pass filter unit as well as to a first end terminal of ohmic voltage divider, wherein the output of anti-alias low pass filter unit is connected to the input of filter module, and wherein the output of filter module is connected to a second end terminal of ohmic voltage divider; wherein the filter module comprises:
a) first, second and third capacitors;
b) first and second resistors;
c) an SC resistor member;
d) the input of the filter module being connected via the first capacitor to the output of the filter module;
e) the input of the filter module being connected via the first resistor and the second capacitor to the reference potential;
f) the output of the filter module being connected via the second resistor and the third capacitor to the reference potential; and
g) a first circuit node between the first resistor and the second capacitor being connected via the SC resistor member to a second circuit node between the second resistor and the third capacitor.

2. The SC filter of claim 1, wherein the SC resistor member comprises a switched capacitor, a first switching means and a second switching means, the first switching means, in a conducting state, discharging the switched capacitor, and the second switching means, in a non-conducting state, electrically separating a terminal of the switched capacitor from one of the first and second circuit nodes.

3. An audio receiver, comprising:

an audio signal input node for receiving an input audio signal;

an audio signal output node for outputting an output audio signal;

an audio signal processor connected between the input node and the output node, the audio signal processor receiving the input audio signal and producing the output audio signal, the audio signal processor including:
a filter module having an RC network with a switched capacitor RC member, the RC network determining a frequency response of the filter module;
an anti-alias low pass filter coupled to the filter module; and
a filter control unit connected in parallel to the filter module and the anti-aliasing filter, the filter control unit including a voltage divider having a first end terminal coupled to the anti-alias low pass filter and a second end terminal coupled to the filter module, wherein the filter module and anti-alias low pass filter are connected in series, and wherein the filter control unit disables the filter module and low pass filter in response to being set to a neutral setting and enables the filter module and low pass filter to filter the input audio signal when set in a non-neutral setting, the filter control unit preventing the filter module and low pass filter from causing signal distortions in the output audio signal when the filter control unit disables the filter module and low pass filter, wherein the filter module includes:

a first capacitor connected between the low pass filter and the filter control unit;

a second capacitor having a first plate and a second plate, the second plate being connected to a reference potential;

a third capacitor having a first plate and a second plate, the second plate being connected to a reference potential;

a first resistor connecting the first plate of the second capacitor to the low pass filter;

a second resistor connecting the first plate of the third capacitor to the filter control unit; and an SC resistor member connecting the first plate of the second capacitor with the first plate of the third capacitor.

4. The audio receiver of claim 3, wherein the audio signal processor further includes:

an operational amplifier having a first input, a second input, and an output, the first input being coupled to the audio signal input node, the output being coupled to the audio signal output node, wherein the voltage divider has a control tap connected to the second input of the operational amplifier and the first end terminal is connected to the output of the operational amplifier.

5. The audio receiver of claim 3 wherein the switched capacitor RC member includes:

an input and an output;

a first switch connected to the input and having first and second positions;

a second switch connected to the output and having first and second positions; and a capacitor having first and second plates, wherein when the first and second switches are in their first positions, the first switch connects the first plate to the input and the second switch connects the second plate to the output, and when the first and second switches are in their second positions, the first switch connects the input to a reference potential, the second switch connects the output to the reference potential, and the capacitor is disconnected from the input and output.

* * * * *